US005668885A

United States Patent [19]

Oda

[11] Patent Number: 5,668,885

[45] Date of Patent: Sep. 16, 1997

[54] LOW FREQUENCY AUDIO CONVERSION CIRCUIT

[75] Inventor: Mikio Oda, Yawata, Japan

[73] Assignee: Matsushita Electric Industrial Co., Ltd., Osaka, Japan

[21] Appl. No.: 607,435

[22] Filed: Feb. 27, 1996

[30] Foreign Application Priority Data

Feb. 27, 1995 [JP] Japan .................................... 7-038330

[51] Int. Cl.[6] ...................................................... H03G 5/00

[52] U.S. Cl. ............................................................... 381/98

[58] Field of Search ................................ 381/67, 98, 101, 381/102, 103, 68.2, 1

[56] References Cited

U.S. PATENT DOCUMENTS

| | | | |
|---|---|---|---|
| 4,220,160 | 9/1980 | Kimball et al. | 381/67 |
| 4,594,731 | 6/1986 | Lewkowicz | 381/67 |
| 4,698,842 | 10/1987 | Mackie et al. | 381/98 |
| 4,821,327 | 4/1989 | Furugard et al. | 381/67 |

FOREIGN PATENT DOCUMENTS

| | | |
|---|---|---|
| 62-232298 | 10/1987 | Japan . |
| 1-91510 | 4/1989 | Japan . |
| 3-168800 | 7/1991 | Japan . |

*Primary Examiner*—Curtis Kuntz
*Assistant Examiner*—Vivian Chang
*Attorney, Agent, or Firm*—Ratner & Prestia

[57] ABSTRACT

A low frequency audio conversion circuit for converting the frequency of low frequency audio components. An input audio signal includes a low frequency audio component lower than the frequency a speaker can reproduce. The low frequency audio component is filtered and extracted by a low pass filter and full-wave rectified to generate even-numbered harmonics of the low frequency audio component. Secondary harmonics are extracted from the even-numbered harmonics and added to the input audio signal after being amplified to an appropriate level. When a speaker whose low frequency sound reproduction characteristics are poor is used, and a low frequency component lower than the frequency the speaker can reproduce is supplied, the low frequency audio component is reproduced as secondary harmonics which fall within the frequency range of the speaker. Thus, the low frequency audio component is compensated, and a powerful sound is reproduced at a low cost without degrading the sound.

2 Claims, 7 Drawing Sheets

LOW FREQUENCY AUDIO CONVERSION CIRCUIT

BACKGROUND OF THE INVENTION

The present invention relates to a low frequency audio conversion circuit for enhancing the presence of low frequency audio by compensating the low frequency component which is deficiently reproduced by a speaker having a poor response for low frequency audio.

The size and shape of a speaker built in an ordinary television receiving set, etc. is restricted by the structure of receiver set, etc. Due to such restrictions, the reproduction of the low frequency sound is limited. Although satellite broadcasting programs and the Hi-vision programs are presented in digital sound, listeners are not able to enjoy the quality music source. In order to improve sound quality, some receiving sets available in the market are equipped with low-frequency dedicated speakers and amplifiers. However, the size of such sets inevitably increases because additional space for incorporating the dedicated speakers and amplifiers is needed. Moreover, such sets often have the problem of sound resonating within the cabinet of the television set.

To overcome these disadvantages, there have been circuits proposed for compensating the low frequency component of an audio signal one of which is shown in FIG. 6.

An exemplary circuit for low frequency compensation is described below with reference to FIG. 6.

In FIG. 6, numeral 10 denotes a low pass filter for extracting the low frequency audio component by passing only the low frequency signals. A normalizer 11 coordinates the amplitude of the low frequency component with that of other frequency components. A second harmonics generator 12 generates secondary harmonics. A third harmonics generator 13 generates tertiary harmonics. A n-th harmonics generator 14 generates n-th harmonics. An adder 15 adds signals from the harmonics generators.

The operation of the low frequency audio component compensation circuit is now described. When an audio signal comes to the circuit, only the low frequency component is extracted by low pass filter 10 and sent to normalizer 11. The normalizer 11 applies a normalization process to the low frequency signal component by coordinating the amplitude of the low frequency component with that of signals in other frequency ranges. The output of normalizer 11 is provided to second harmonics generator 12, third harmonics generator 13, and so on up to the n-th harmonics generator 14 which generates higher order harmonics. In each of the harmonics generators 12–14, the harmonics are generated through the following mathematical processing:

secondary harmonics are obtained according to $$\cos 2\Theta = 2\cos^2\Theta - 1$$

where the original sound: is $-\cos\Theta$, tertiary harmonics are obtained according to $$\cos 3\Theta = 4\cos^3 - 3\cos\Theta,$$

and fourth harmonics are obtained according to $$\cos 4\Theta = 8\cos^4\Theta - 8\cos^2\Theta + 1.$$

Likewise, n-th order harmonics can be determined with similar mathematical formulas. The harmonics of each order are multiplied by a coefficient and then mixed at adder 15 with the original audio input signal to produce a final output signal By using the low frequency audio component compensation circuit described above, even a speaker having poor low frequency reproduction characteristics as shown in FIG. 3(*a*) can reproduce the harmonics. As shown in FIG. 3(*a*), an audio component at frequency f0 is hardly reproducible because the frequency curve 7 of the speaker does not cover, for example, the low range component 8 at frequency f0. The speaker can reproduce, as compound sound, the secondary harmonics 9, tertiary harmonics 16 and the n-th order harmonics 17 of the low frequency audio component at frequency f0, as shown in FIG. 7. The compound sound containing secondary harmonics 9, tertiary harmonics 16 and the n-th harmonics of the low frequency audio component at frequency f0 creates, by taking advantage of the psychological effects of sound on the human auditory sense, an effect as if the low range sound is actually reproduced.

The conventional circuitry described above is difficult to implement with an analog circuit because of the need for mathematical processing. Another problem is that the scale of the circuitry becomes very large. As a matter of course, the conventional circuit is easily implemented by using digital signal processors. However, in this case a large processing program is required, which substantially increases cost.

Moreover, the conventional circuit described above has a drawback in that it eventually produces a malaise in the musical sense. For example, when a 55 Hz sound "la" is inputted, its secondary harmonic is a 110 Hz sound "la", but the tertiary harmonic is a 165 Hz sound which is almost "mi". The synthetic chord of these harmonics and the original sound creates a dissonance. Therefore, the conventional circuitry can only reproduce a sound in which the fidelity to the pitch of original sound is low.

SUMMARY OF THE INVENTION

The present invention solves the above described drawbacks and provides a low frequency audio conversion circuit which compensates for the deficient low frequency sound component that inevitably occurs when a sound is reproduced with a speaker having poor low frequency response. The present invention reproduces a low frequency sound at low cost, without an accompanying malaise in a musical sense.

A low frequency audio conversion circuit according to a first embodiment of the present invention comprises:

a first low pass filter for passing only a low frequency audio component of an input audio signal lower than the lowest frequency that can be reproduced by a speaker, a full wave rectifier coupled to the first low pass filter, for producing even numbered harmonics of the low frequency audio component passed by the first low pass filter, a second low pass filter coupled to the full wave rectifier, for passing only the secondary among an output generated by the full wave rectifier, an amplifier coupled to the second low pass filter, for amplifying the secondary harmonics passed by the second low pass filter, and an adder for adding an output signal from the amplifier for amplifying the secondary harmonics and the input audio signal, to produce an output audio signal.

A low frequency audio conversion circuit according to a second embodiment of the present invention comprises:

a left first low pass filter for passing only a low frequency audio component of an input audio signal of a left channel lower than the lowest frequency that can be reproduced by a speaker, a left full wave rectifier coupled to the left first low pass filter, for producing even-numbered harmonics of the low frequency audio component passed by the left fast low pass filter, a left second low pass filter coupled to the left full wave rectifier, for passing only the secondary harmonics among the even-numbered harmonics generated by the left full wave rectifier, a left amplifier, coupled to the left second low pass filter, for amplifying the secondary harmonics extracted by the left second low pass filter, and a left second adder for adding an output signal from the left amplifier for amplifying the secondary harmonics and the left channel audio input signal, to produce a left channel audio output signal, a right first low pass filter for passing only a low frequency audio component of the input audio signal of a right channel lower than the lowest frequency that can be reproduced by a speaker, a right full wave rectifier coupled to the right first low pass filter, for producing even-numbered harmonics of the low frequency audio component passed by the right first low pass filter, a right second low pass filter coupled to the right full wave rectifier, for passing only the secondary harmonics among the even-numbered harmonics generated by the right full wave rectifier, a right amplifier coupled to the right second low pass filter, for amplifying the secondary harmonics passed by the right second low pass filter, and a right adder for adding an output signal from the right amplifier for amplifying the secondary harmonics and the right channel audio input signal, to produce a right channel audio output signal.

A low frequency audio conversion circuit according to a third embodiment of the present invention comprises:

a first adder for adding a left channel audio input signal and a right channel audio input signal, a first low pass filter coupled to the first adder, for passing only a low frequency audio component, produced by said first adder, lower than the lowest frequency that can be reproduced by a speaker, a full wave rectifier coupled to the first low pass filter, for producing even-numbered harmonics of the low frequency audio component passed by the first low pass filter, a second low pass filter coupled to the full wave rectifier, for passing only secondary harmonics among the even-numbered harmonics generated by the full wave rectifier, an amplifier coupled to the second low pass filter, for amplifying the secondary harmonics passed by the second low pass filter, a left second adder for adding an output signal from the amplifier and the left channel audio input signal, to produce a left channel audio output signal, and a right second adder for adding an output signal from the amplifier for amplifying the secondary harmonics and the right channel audio input signal, to produce a right channel audio output signal.

Low frequency audio conversion circuits according to the above described first, second and third embodiments of the present invention enable reproduction of a low frequency audio component, which is lower than the lowest frequency a speaker can reproduce, as an audio component that falls within the frequency range of the speaker by converting an audio component having a frequency lower than the lowest frequency a speaker can reproduce, into secondary harmonics. In this way, a low frequency audio component, absent from a conventional speaker output, is artificially compensated for and a sound rich in low frequency presence is reproduced without the accompanying malaise in a musical sense.

BRIEF DESCRIPTION OF THE DRAWINGS

FIG. 3(*b*) shows the reproduction frequency curve of a speaker, the input low frequency audio signal and the secondary harmonic.

DESCRIPTION OF THE PREFERRED EMBODIMENTS

A low frequency audio conversion circuit according to a first embodiment of the present invention is described in detail below with reference to FIG. 1, FIG. 2 and FIG. 3.

Figure 1:
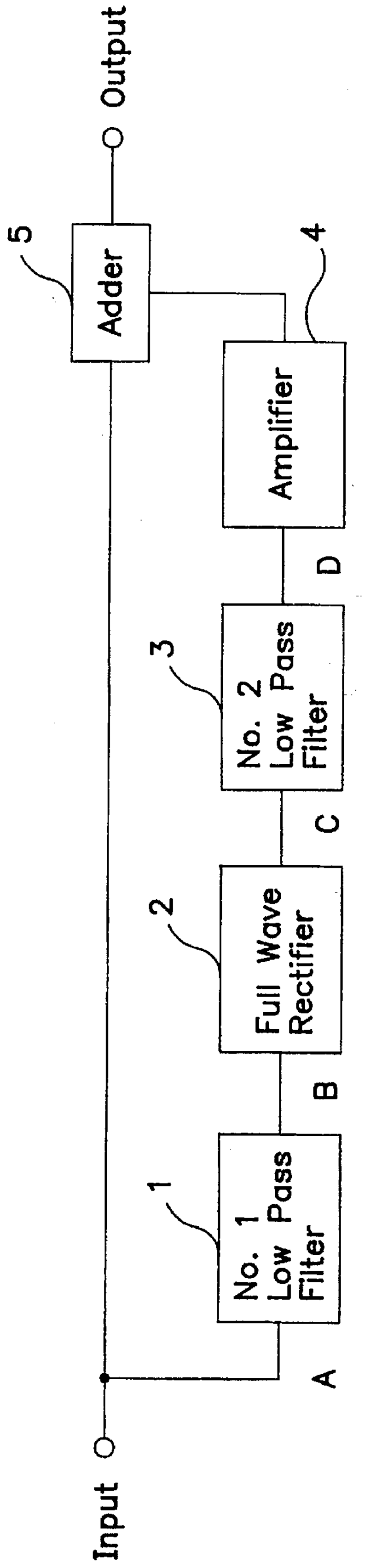
FIG. 1 is a block diagram of a low frequency audio conversion circuit according to a first embodiment of the present invention.

FIG. 1 is a block diagram of a low frequency audio conversion circuit according to a first embodiment of the present invention.

In FIG. 1, numeral 1 denotes a first low pass filter which receives input audio signals and passes only low frequency audio signals having a frequency lower than the lowest reproduction limit of a speaker. Full wave rectifier 2 generates even-numbered harmonics. A second low pass filter 3 passes only the secondary harmonics among the even-numbered harmonics generated by the full wave rectifier 2. Amplifier 4 amplifies the secondary harmonics supplied from the second low pass filter 3. An adder 5 adds the input audio signal and the amplified secondary harmonics signal.

Next, the operation of a low frequency audio conversion circuit according to the first embodiment of the present invention is described. FIG. 3(*a*) shows the relationship between the reproduction frequency curve 7 of a speaker and the low frequency audio component of a signal 8 at frequency f0. Speakers used in TV receivers, etc. are usually small-sized and the lowest frequency of reproduction by such speakers is around 100 Hz, as shown in FIG. 3(*a*). In the normal music signal, there is an audio component having a frequency f0 below 100 Hz which provides a powerful low frequency sound. Because of the poor reproduction characteristics in the low frequency range, such speakers are unable to reproduce the signal having the frequency f0 and hence, cannot offer an appealing low frequency sound.

Figure 3A:
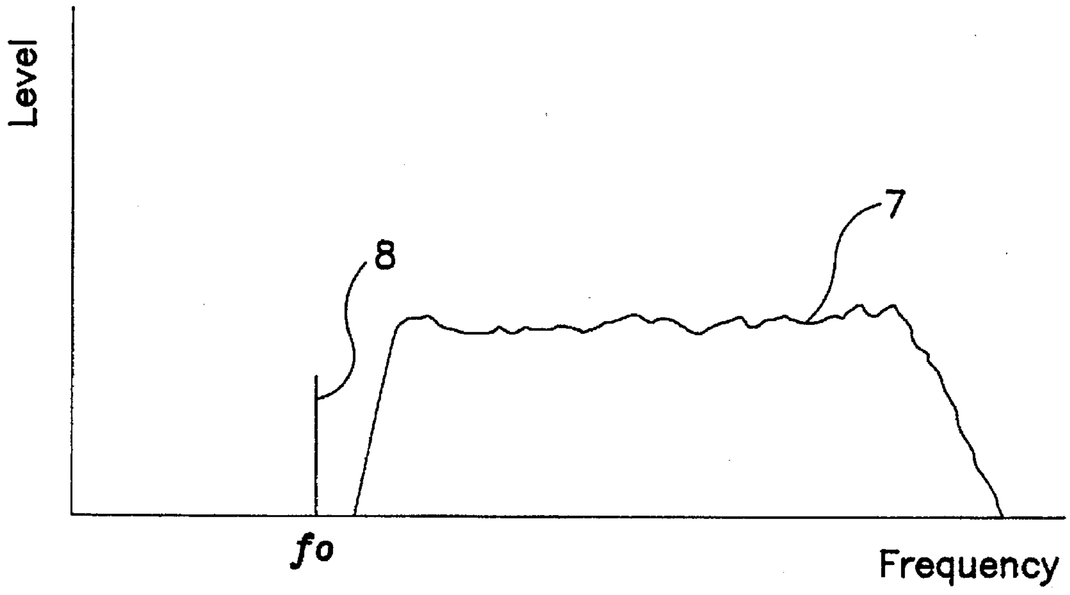
FIG. 3(*a*) shows the relationship between the reproduction frequency curve of a speaker and the input low frequency audio signal.
Figure 3B:
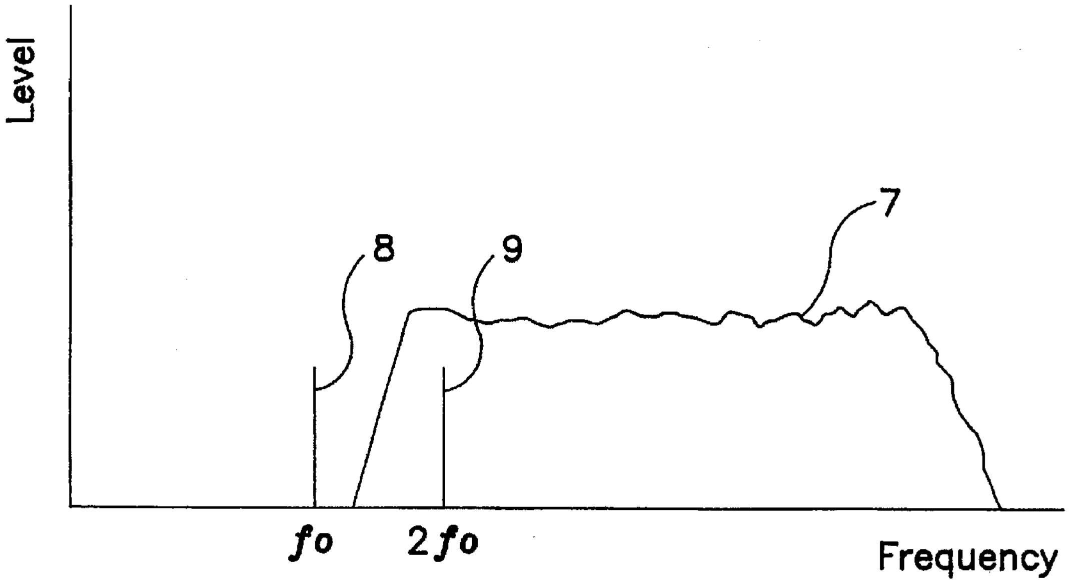

FIG. 3(*b*) illustrates the relationship among the frequency f0 lower than the lowest limit of sound reproduction curve 7 of a speaker, the secondary harmonic signal of the f0 signal, and the reproduction frequency curve 7 of a speaker. In the first embodiment of the invention, the f0 signal is converted to its second harmonic (a sound signal having a frequency one octave higher than frequency f0), which falls within the frequency range of a speaker to provide a sound rich in a low frequency sound.

In FIG. 1, a frequency component which is lower than the lowest frequency a speaker in use can reproduce is extracted from the input audio signal by the No. 1 low pass filter 1, and the low frequency component thus extracted is rectified by full wave rectifier 2 to generate even-numbered harmonics.

Defining the input signal B=sin (wt), the output signal C produced by the full wave rectifier 2 is expressed through Fourier expansion by the formula $$C=(2/\Pi)+(4/\Pi)\bullet\{\sin(2wt)/3-\sin(4wt)/15+\sin(6wt)/35\ldots\}.$$

The formula represents that the full wave rectified output includes even-numbered harmonics, and that, as the coefficients indicate, more than 80% are the secondary harmonics.

By letting only the secondary harmonics pass through the No. 2 low pass filter 3, the secondary harmonics can be extracted efficiently. Then, the secondary harmonics which passed through the No. 2 low pass filter 3 are amplified by amplifier 4 to produce a signal of an appropriate level. The amplified secondary harmonics are added by adder 5 to the input audio signal to produce an output audio signal.

Figures 2A, 2B, 2C, 2D:
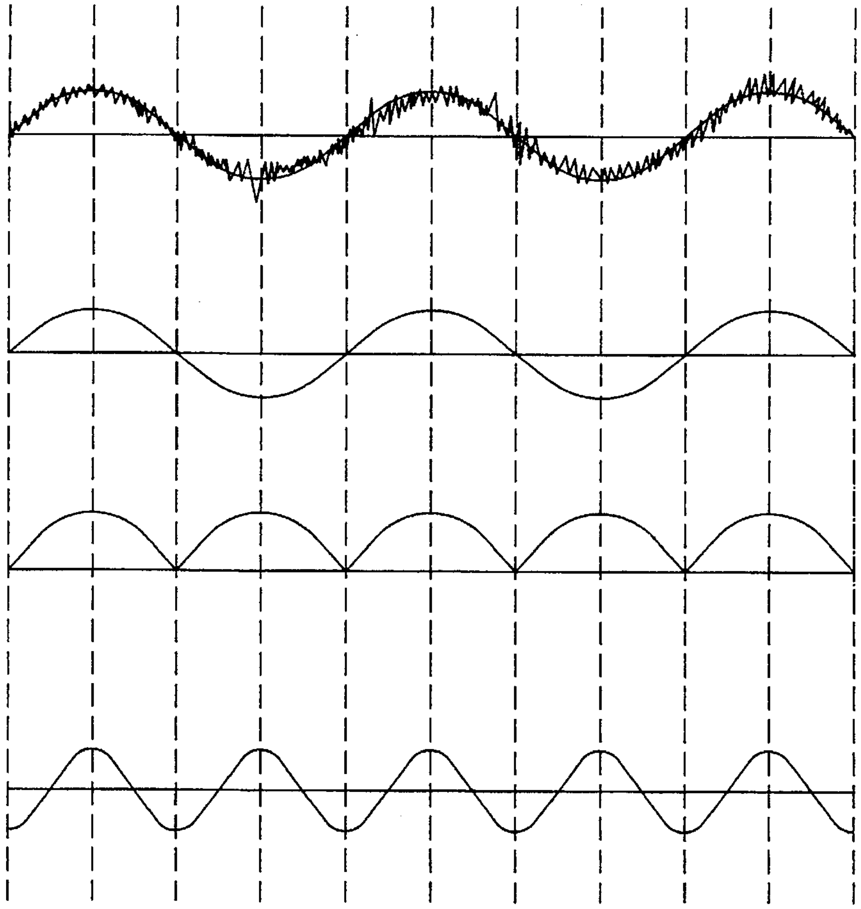
FIG. 2 is a wave form chart showing the function of each part of a low frequency audio conversion circuit according to the first embodiment.

FIG. 2 shows the waveforms at each of the components shown in FIG. 1, where A is the input audio signal, B is the output of the No. 1 low pass filter 1, C is the output of the full wave rectifier 2, D is the output of the No. 2 low pass filter 3. In this way, secondary harmonics of an audio signal below the lowest frequency a speaker can reproduce contained in an input audio signal are generated, to be converted into a signal within the frequency range the speaker can reproduce, which is to be added to the input audio signal. The audio signal added to the input audio signal includes only secondary harmonics having a frequency higher than the original audio signal frequency by one octave. Therefore, no dissonance is created. The original low frequency audio signal s is never reproduced because what is added to the input audio signal is a signal one octave higher than the original sound. However, according to experiments, the reproduced sound is recognized by listeners as a sound that has been reinforced with the low frequency signal, unless the listeners have a full knowledge and memory of the corresponding musical score. A better effect is produced by reproducing a sound with a low frequency component below the lowest limit a speaker can reproduce as secondary harmonics, rather than eliminating the low frequency component. The present invention is more effective than conventional methods where the level of low sound range is raised with a tone control technique.

In the first embodiment above, the low frequency audio conversion r circuit is used for reproduction of a monaural signal. A circuit for stereo reproduction is described below as a second embodiment.

Figure 4:
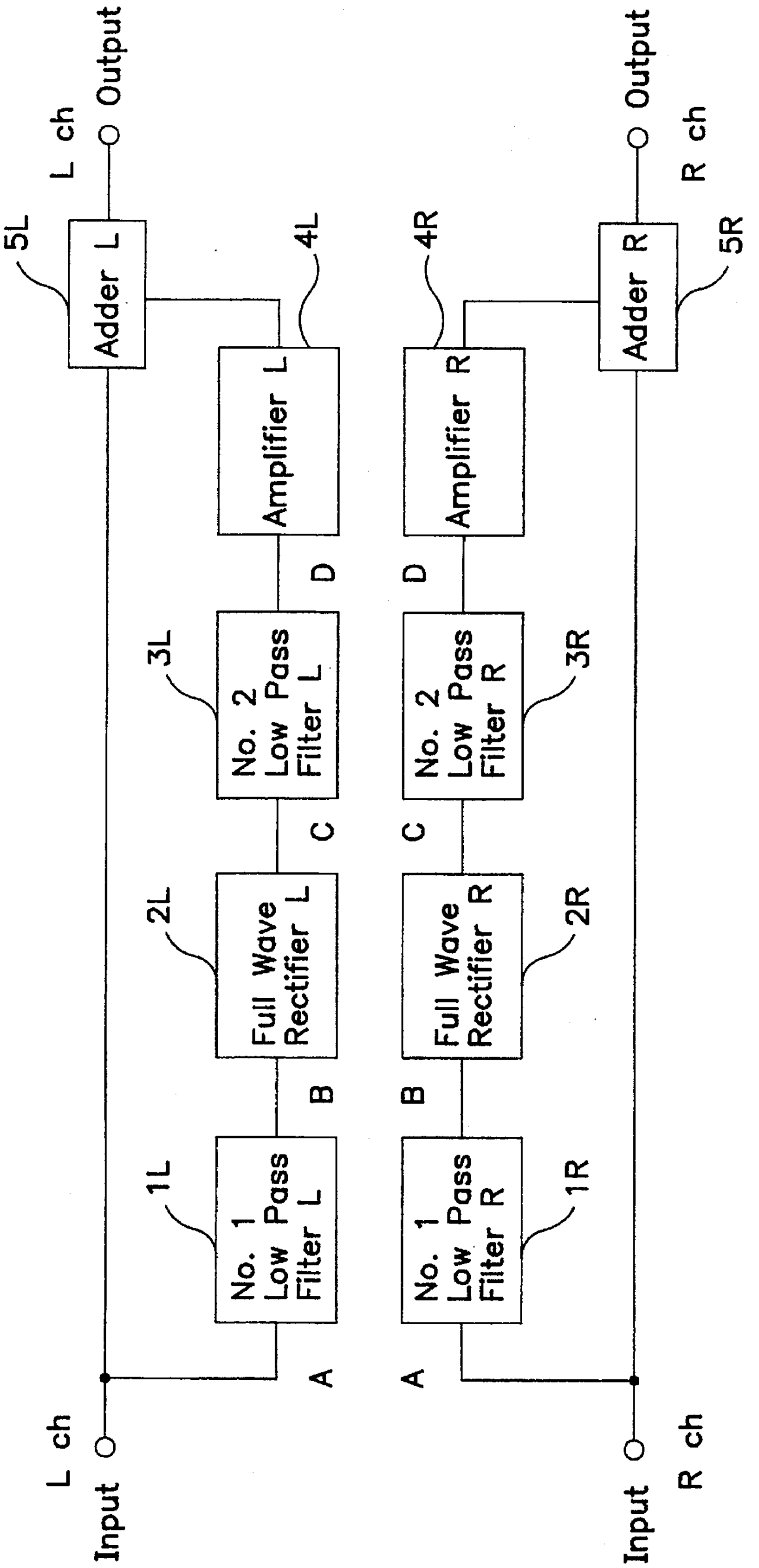
FIG. 4 is a block diagram of a low frequency audio conversion circuit according to a second embodiment of the present invention.

FIG. 4 shows a low frequency audio conversion circuit for stereo reproduction according to a second embodiment of the present invention. Because stereo reproduction needs processing of two signal channels, this embodiment employs two channels of the circuitry as described in the first embodiment. In FIG. 4, with respect to the left channel, a low frequency component below the lowest frequency a speaker can reproduce is extracted from the left channel audio input signal by a left No. 1 low pass filter 1L, which passes only a low frequency audio signal below the lowest reproduction frequency range. A left full wave rectifier 2L rectifies the low frequency audio component extracted by the left No. 1 low pass filter 1L to generate even-numbered harmonics. The output from left full wave rectifier 2L, which contains even-numbered harmonics, is supplied to left No. 2 low pass filter 3L which passes only the secondary harmonics. Thus, only the secondary harmonics are extracted. The secondary harmonics extracted by left No. 2 low pass filter 3L are amplified to produce a signal of an appropriate level by a left amplifier 4L. The amplified secondary harmonics are added by a left adder 5L to the left channel audio input signal, to make a left channel audio output signal.

With respect to the right channel, a low frequency audio component below the lowest frequency a speaker can reproduce is extracted from the right channel audio input signal by a right No. 1 low pass filter 1R which passes only a low frequency audio signal below the lowest reproduction frequency range. A right full wave rectifier 2R rectifies the low frequency component extracted by the right No. 1 low pass filter 1R to generate even-numbered harmonics. The output signal from right full wave rectifier 2R containing even-numbered harmonics is supplied to right No. 2 low pass filter 3R which passes only the secondary harmonics. Thus, only the secondary harmonics are extracted. The secondary harmonics extracted by right No. 2 low pass filter 3R are amplified to produce a signal of an appropriate level by a right amplifier 4R. The amplified secondary harmonics are added by a right adder 5R to the right channel audio input signal, to make a right channel audio output signal.

The symbols A, B, C and D in FIG. 4 correspond respectively to waveforms A, B, C, and D of FIG. 2, which show the waveform produced by each component. FIG. 2 illustrates how the low frequency component below the lowest frequency a speaker can reproduce contained in an input sound signal is converted to secondary harmonics.

As described above, in stereo sound reproduction, a low frequency component can be reinforced without any accompanying dissonance by using two channels of low frequency audio conversion circuitry for monaural sound reproduction. The secondary harmonics of a low frequency component below the lowest frequency a speaker can reproduce contained in an input sound signal are generated and added to the input audio signal.

Figure 5:
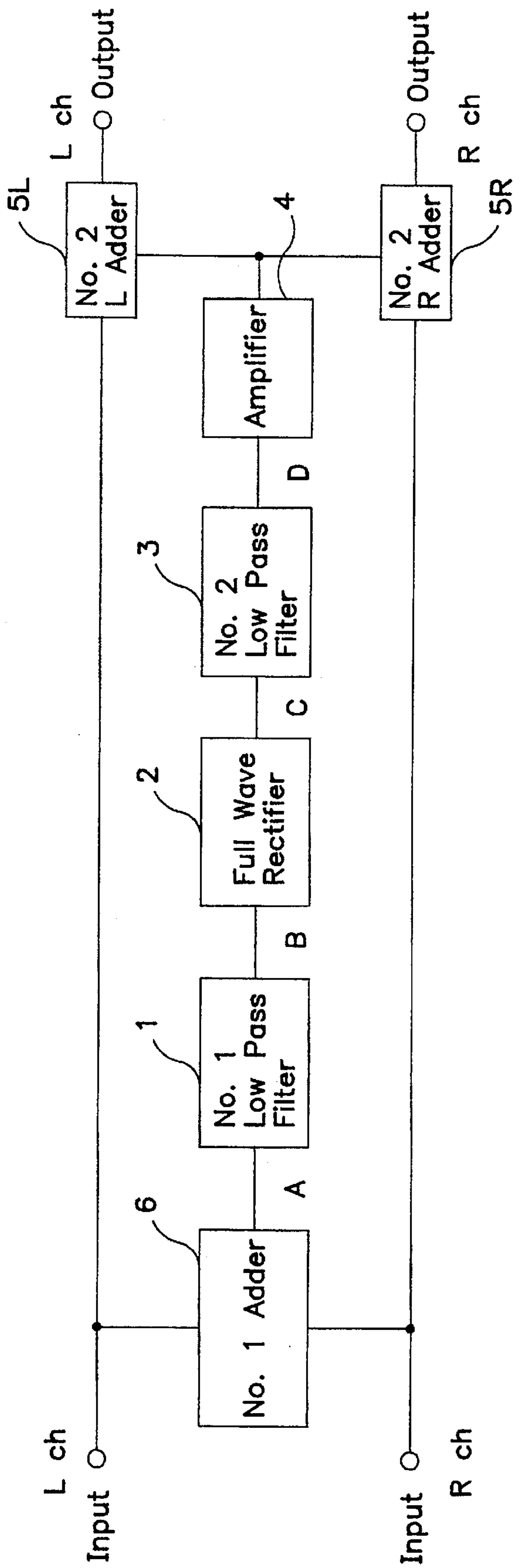
FIG. 5 is a block diagram of a low frequency audio conversion circuit according to a third embodiment of the present invention.
Figure 6:
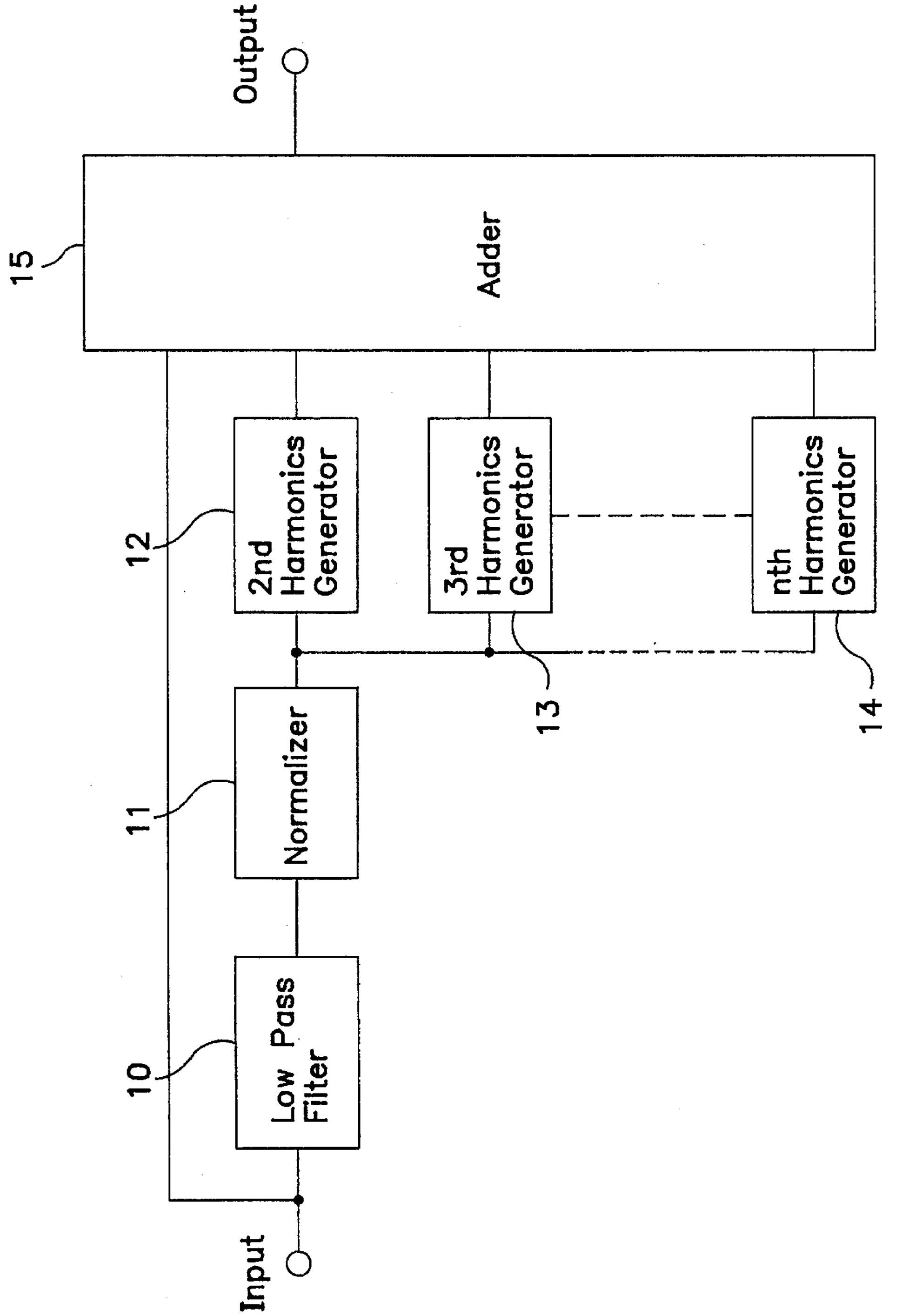
FIG. 6 Prior Art
FIG. 6 is a block diagram of a conventional low frequency audio conversion circuit.
Figure 7:
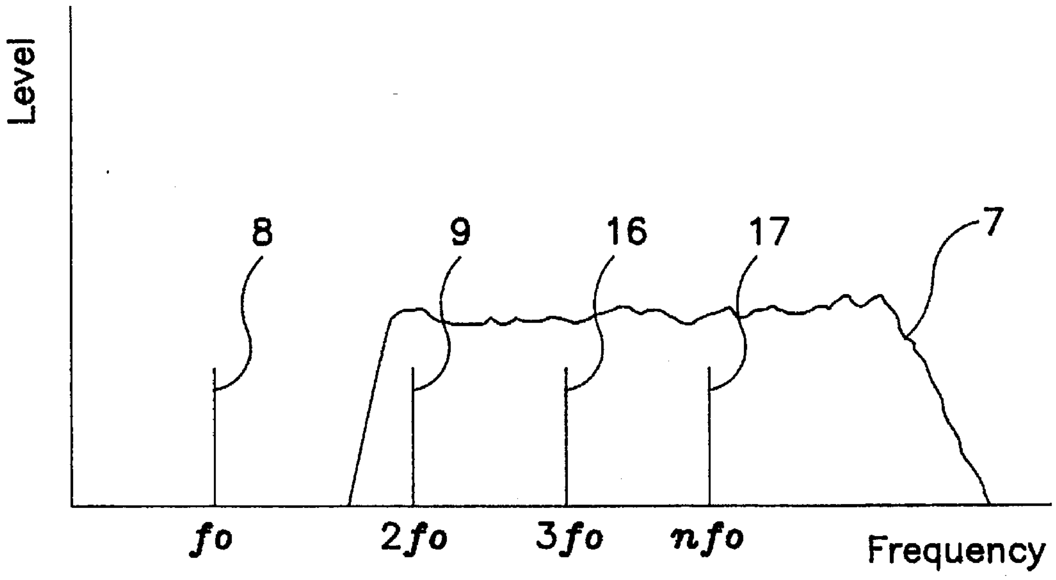
FIG. 7 Prior Art
FIG. 7 shows the relationship among the reproduction frequency curve of a speaker, input low frequency audio signal and the harmonic signals, in a conventional low frequency audio conversion circuit.

Another low frequency audio conversion circuit for stereo sound reproduction is described as a third embodiment of the present invention. This embodiment is a reduced version of the second embodiment shown in FIG. 4 for the purpose of cost reduction. FIG. 5 shows the circuit of the third embodiment.

In FIG. 5, numeral 6 denotes a first adder for adding a left channel audio input signal and a right channel audio input signal. A first low pass filter passes only a low frequency audio signal lower than the frequency a speaker can reproduce A full wave rectifier 2 generates even-numbered harmonics and converts the frequency. A second low pass filter 3 passes only the secondary harmonics among the even-numbered harmonics generated by the full wave rectifier 2. An amplifier 4 amplifies the secondary harmonics signal supplied from the second low pass filter 3 to an appropriate level. A left second adder 5L adds the amplified secondary harmonics signal to the left input audio signal. A right second adder 5R adds the amplified secondary harmonics signal to the right input audio signal.

In this embodiment, the left and the right input audio signals are added in No. 1 adder 6 to have the left channel audio input signal and the right channel audio input signal combined instead of directly entering a low pass filter. The combined left/right input audio signal is provided to No. 1 low pass filter 1 to have low frequency audio signals lower than the frequency a speaker can reproduce extracted. The low frequency audio signal thus extracted is rectified by full wave rectifier 2 to generate even-numbered harmonics and convert the frequency. From the frequency-converted output of full wave rectifier 2, which contains even-numbered harmonics, only the secondary harmonics are extracted by No. 2 low pass filter 3, and then amplified by amplifier 4 to an appropriate level. The secondary harmonics amplified by amplifier 4 to an appropriate level are, in one side, added by a left second adder 5L to the left input audio signal, to be outputted as a left audio output signal. The secondary harmonics amplified by amplifier 4 to an appropriate level are, in the other side, added by a right second adder 5R to the right input audio signal, to be outputted as a right audio output signal.

Symbols A, B, C and D in FIG. 5 correspond respectively to A, B, C and D of FIG. 2, which show the waveforms produced by each component and how a low frequency audio component which is lower than the frequency a speaker can reproduce is converted into secondary harmonics.

As described above, in stereo sound reproduction, a low frequency component can be reinforced without any accompanying dissonance by using a first adder which adds the left and the right channel audio input signals. One series circuit consisting of a first low pass filter, a full wave rectifier, a second low pass filter and an amplifier, and two second adders create the secondary harmonics of a low frequency component below the lowest frequency a speaker can reproduce contained in an input audio signal, and adds the secondary harmonics of the low frequency component to the input audio signal. Even with a simplified circuit as described above, a low frequency audio conversion circuit is implemented which empirically provides a sufficient effect, although slightly inferior in the fidelity of the sound when compared to the second embodiment.

As explained in the foregoing descriptions, a low frequency audio conversion circuit according to the present invention enables a low frequency component lower than the frequency a speaker can reproduce supplied to a speaker whose low frequency sound reproduction characteristics are poor because of restrictions in size and shape, to be reproduced as a powerful sound in which the low frequency component, which is deficient in the speaker output, is compensated for, without degrading the sound reproduced, by converting the low frequency component into secondary harmonics to be added to an input audio signal. Another advantage of e the present invention is that it may be implemented using a low cost analog circuit.

What is claimed:

1. A low frequency audio conversion circuit comprising:

a first low pass filter for preferentially passing a low frequency audio component of an input audio signal lower than the lowest frequency which can be reproduced by a speaker, a full wave rectifier coupled to said first low pass filter, for producing even-numbered harmonics of the low frequency audio component passed by said first low pass filter, a second low pass filter coupled to said full wave rectifier, for passing a signal which includes secondary harmonics to the relative exclusion of other even-numbered harmonics supplied from said full wave rectifier, an amplifier, coupled to said second low pass filter, for amplifying the signal passed by said second low pass filter to produce an output signal, and an adder for adding the output signal from said amplifier and the input audio signal, to produce an output audio signal.

2. A low frequency audio conversion circuit comprising:

a left first low pass filter for preferentially passing a low frequency audio component of a left channel audio input signal lower than the lowest frequency which can be reproduced by a speaker, a left full wave rectifier coupled to said left first low pass filter, for producing even-numbered harmonics of the low frequency audio component passed by said left first low pass filter, a left second low pass filter coupled to said left full wave rectifier for passing a signal which includes secondary harmonics to the relative exclusion of other even-numbered harmonics supplied from said left full wave rectifier, a left amplifier, coupled to said left second low pass filter, for amplifying the signal extracted by said left second low pass filter to produce an output signal, a left adder for adding the output signal from said left amplifier and the left audio signal, to produce a left channel audio output signal, a right first low pass filter for preferentially passing a low frequency audio component of a right channel audio input signal lower than the lowest frequency which can be reproduced by a speaker, a right full wave rectifier coupled to said right first low pass filter, for producing even-numbered harmonics of the low frequency audio component passed by said right first low pass filter, a right second low pass filter coupled to said right full wave rectifier for passing a signal which includes secondary harmonics to the relative exclusion of other even-numbered harmonics supplied from said right full wave rectifier, a right amplifier, connected to said right second low pass filter, for amplifying the signal passed by said right second low pass filter to produce an output signal, and a right adder for adding the output signal from said right amplifier and the right input audio signal, to produce a right channel audio output signal.

* * * * *